United States Patent
Lin et al.

(10) Patent No.: US 10,371,719 B2
(45) Date of Patent: Aug. 6, 2019

(54) PRINTED CIRCUIT BOARD CIRCUIT TEST FIXTURE WITH ADJUSTABLE DENSITY OF TEST PROBES MOUNTED THEREON

(71) Applicant: KINSUS INTERCONNECT TECHNOLOGY CORP., Taoyuan (TW)

(72) Inventors: Ting-Hao Lin, Taoyuan (TW); Chiao-Cheng Chang, Taoyuan (TW); Yi-Nong Lin, Taoyuan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 612 days.

(21) Appl. No.: 15/130,982

(22) Filed: Apr. 17, 2016

(65) Prior Publication Data

US 2017/0299632 A1    Oct. 19, 2017

(51) Int. Cl.
*G01R 1/073* (2006.01)
*G01R 31/28* (2006.01)

(52) U.S. Cl.
CPC ..... *G01R 1/07378* (2013.01); *G01R 31/2808* (2013.01)

(58) Field of Classification Search
CPC .......................... G01R 1/07378; G01R 31/2808
See application file for complete search history.

(56) References Cited

U.S. PATENT DOCUMENTS

| | | | | |
|---|---|---|---|---|
| 6,991,470 B2* | 1/2006 | Muench | ............... | H01L 23/057 174/261 |
| 7,888,803 B2* | 2/2011 | Kariya | ............. | H01L 23/49822 257/296 |
| 2002/0102746 A1* | 8/2002 | Deas | .................. | G01R 1/07378 438/12 |
| 2006/0255817 A1* | 11/2006 | Yamagishi | ......... | G01R 1/07378 324/754.07 |
| 2008/0191720 A1* | 8/2008 | Mochizuki | ......... | G01R 1/07307 324/754.07 |
| 2010/0243311 A1* | 9/2010 | Niki | ....................... | H05K 3/422 174/266 |
| 2012/0194213 A1* | 8/2012 | Komatsu | ............ | G01R 31/2887 324/756.03 |

\* cited by examiner

*Primary Examiner* — Huy Q Phan
*Assistant Examiner* — Zannatul Ferdous
(74) *Attorney, Agent, or Firm* — Pai Patent & Trademark Law Firm; Chao-Chang David Pai

(57) ABSTRACT

A printed circuit board (PCB) test fixture includes a substrate, a first insulation layer formed on the substrate, a conductor layer formed on the first insulation layer and electrically connected to the upper electrodes through at least one first connection member, a second insulation layer formed on the first insulation layer, and multiple conductive cones arranged on the second insulation layer in a matrix form. A part of the conductive cones is electrically connected to the conductor layer through at least one second connection member. The circuit layout of the conductor layer, the at least one first connection member and the at least one second connection member is employed to supply testing power to a part of the conductive cones and an adjustable arrangement of the conductive cones to enhance density of test probes upon electrical testing.

10 Claims, 7 Drawing Sheets

PRINTED CIRCUIT BOARD CIRCUIT TEST FIXTURE WITH ADJUSTABLE DENSITY OF TEST PROBES MOUNTED THEREON

BACKGROUND OF THE INVENTION

1. Field of the Invention

The present invention relates to a printed circuit board (PCB) circuit test fixture and, more particularly, to a PCB circuit test fixture with adjustable density of test probes mounted thereon.

2. Description of the Related Art

Being one of basic procedures required for PCB fabrication, electrical testing is applied to test if a PCB to be tested is functioning and is ideally carried out by appropriate test equipment. During electrical testing, a PCB is placed on a test fixture of test equipment. The test equipment supplies power to the test fixture that further selectively supplies power to electrodes or points to be tested on the PCB to perform electrical testing of the PCB. With reference to FIG. 5, a conventional test fixture 70 includes a base board 71, two springs 72, an elevatable board 73, multiple stretchable probes 74 and a masking board 75. The base board 71 has multiple probe holes 76 formed in the base board 71 and evenly distributed on a top surface of the base board 72 in the form of a matrix. The two springs 72 are securely mounted on the top surface of the base board and are spaced apart from each other. The elevatable board 73 is mounted on top ends of the two springs 72 to vertically move according to a compression state of the two springs. The elevatable board 73 has multiple through holes 77 formed through the elevatable board 72 and corresponding to the respective probe holes 76.

Each stretchable probe 74 has a probe cap 741 and a stretchable portion 742. The stretchable portion 742 is mounted in one of the probe holes 76. A bottom portion of the probe cap 741 is securely connected with a top end of the stretchable portion 742.

When the test fixture 70 is applied to test a PCB 80, the masking board 75 should be prepared beforehand and has multiple openings 751 respectively aligning with multiple electrodes 81 or points to be tested of the PCB 80 and a part of the multiple through holes 77 of the elevatable board 73. After the masking board 75 is stacked on the elevatable board 73 and the PCB 80 is stacked on the masking board 75, the masking board 75 and the elevatable board 73 compress the two springs 72 due to gravity, such that the elevatable board 73 moves toward the base board 71. Meanwhile, a part of the probe caps 741 of the stretchable probes 74 penetrate through the through holes 77 of the elevatable board 73 and a part of the openings 751 of the masking board 75 for the part of the probe caps 741 to be electrically connected to the multiple electrodes 81 of the PCB 80. As the stretchable portion 742 of each probe is connected with a wire for supplying power to the probe 74, when the probe cap 741 of the probe is connected to a corresponding electrode 81 of the PCB 80, power is supplied to the corresponding electrode 81 to perform electrical testing on the PCB 80. The probe caps 741 of those stretchable probes 74 not aligning with the electrodes 81 are blocked by the masking board 75 and do not contact the PCB 80 to prevent short-circuit or inadvertent touch from occurring on the conducting area, such as conductor patterns, on the PCB 80.

However, to avoid short-circuit arising from mutual contact of the stretchable probes 74, it is critical to keep a distance between adjacent two of the stretchable probes 74 at least not less than a specific distance. However, the distance between adjacent two of the through holes 77 of the elevatable board 73 should be fixed, such that the distance between adjacent two of the stretchable probes 74 fails to be further shortened and this in turn limits a density of the points on the PCB to be tested down to a low value. Therefore, the stretchable probes 74 fail to contact all the electrodes or points to be tested on the PCB 80 and some points to be tested supposed to be conducting but not conducting are not tested or the test results are incorrect.

With reference to FIG. 6A, to solve the issue of insufficient density of the points on the PCB to be tested, the approach is to employ another test fixture with a different structure, which has at least one auxiliary board 78 stacked on the masking board 75 with each auxiliary board 78 having multiple through holes 781 formed through the auxiliary board 78. When those stretchable probes 74 are not slanted, a probe distance between top portions of adjacent two of the probes 74 is L1. When a test distance L2 between adjacent two of the electrodes 81 of the PCB 80 is less than the probe distance L1, a part of the electrodes 81 fails to be electrically connected to the stretchable probes 74, causing missed points or incorrect results in the electrical testing.

With reference to FIG. 6B, when the auxiliary board 78 is horizontally moved, the through holes 781 of the at least one auxiliary board 78 are also horizontally moved. When the distance of the movement exceeds a diameter of the through holes 781, during the course of movement, the through holes 781 abut against and push up corresponding probe caps 741 in slanted positions. The oblique angle of the probe caps 741 is determined by the location, size and distance of movement of the through holes 781. If the distance of movement does not exceed the diameter of the through holes 781, the stretchable probes 74 inside the respective through holes 781 won't be slanted at all or the oblique angle of the stretchable probes 74 is minor. Hence, a part of the stretchable probes 74 stays upright and the remaining stretchable probes 74 are pushed obliquely toward the unslanted stretchable probes 74, such that the probe distance L1 between the probe caps 741 can be shortened to be identical to the test distance L2 between the electrodes 81, so as to increase the density of points on a PCB 80 to be tested in the electrical testing.

Given the at least one auxiliary board 78 pushing obliquely against the stretchable probes 74, the probe distance L1 between the probe caps 741 can be reduced. However, during the course of movement, due to a large oblique angle and varying length and elasticity of the stretchable probes 74, the slanted stretchable probes 74 sometimes fail to contact the electrodes 81 of the PCB 80 or just touch edge portions of the probes 81 to result in irregular test results. Additionally, frequent abrasion, damage and wear-out against the stretchable probes 74 arise from excessive oblique movement of the stretchable probes 74. Accordingly, purchase of a large amount of stretchable probes 74 becomes necessary as a result of the shortened life duration of the stretchable probes 74.

SUMMARY OF THE INVENTION

An objective of the present invention is to provide a printed circuit board (PCB) test fixture with adjustable density of test probes mounted thereon, which can tackle the problems of insufficient density of test probes upon electrical testing, damage and wear-out to test probes because of frequently tilted test probes and improper electrode contact or connection failure arising from test points on PCB being out of reach from test probes.

To achieve the foregoing objective, the PCB test fixture with adjustable density of test probes mounted thereon includes a substrate, multiple lower electrodes, multiple upper electrodes, a first insulation layer, a conductor layer, a second insulation layer and multiple conductive cones.

The substrate has a lower surface and an upper surface.

The multiple lower electrodes are formed on the lower surface of the substrate.

The multiple upper electrodes are formed on the upper surface of the substrate and are electrically connected to the respective lower electrodes.

The first insulation layer is formed on the upper surface of the substrate and has at least one first connection member electrically connected to corresponding upper electrodes.

The conductor layer is formed on the first insulation layer and is electrically connected to the at least one first connection member and the corresponding upper electrodes.

The second insulation layer is formed on the first insulation layer and has at least one second connection member electrically connected to the conductor layer.

The multiple conductive cones are formed on the second insulation layer and are adapted to electrically contact a PCB to be tested. A part of the multiple conductive cones is electrically connected to the respective at least one second connection member.

From the foregoing circuit layout of the PCB test fixture, the conductive cones serve to connect with multiple test points on a PCB to be tested, the lower electrodes on the substrate are connected with external wires to transmit power to the upper electrodes, and the upper electrodes selectively supply power to the conductive cones connected to the test points through the conductor layer, the at least one first connection member and the at least one second connection member while the unconnected conductive cones receive no power. The PCB test fixture adopts the conductive cones as test probes. The conductor layer, the at least one first connection member and the at least one second connection member are employed to selectively supply power to desired conductive cones upon testing of the PCB to be tested. To replace conventional probes with the conductive cones, the PCB test fixture effectively increases the density of test probes thereon upon high-density electrical testing. As it is unnecessary for the test probes to be tilted, test procedures can be simplified and test time can be shortened. As no purchase of test probes is required, the PCB test fixture further reduces the cost in its operation and the concern of mounting and replacing test probes is no longer necessary.

Other objectives, advantages and novel features of the invention will become more apparent from the following detailed description when taken in conjunction with the accompanying drawings.

DETAILED DESCRIPTION OF THE INVENTION

Figure 1:
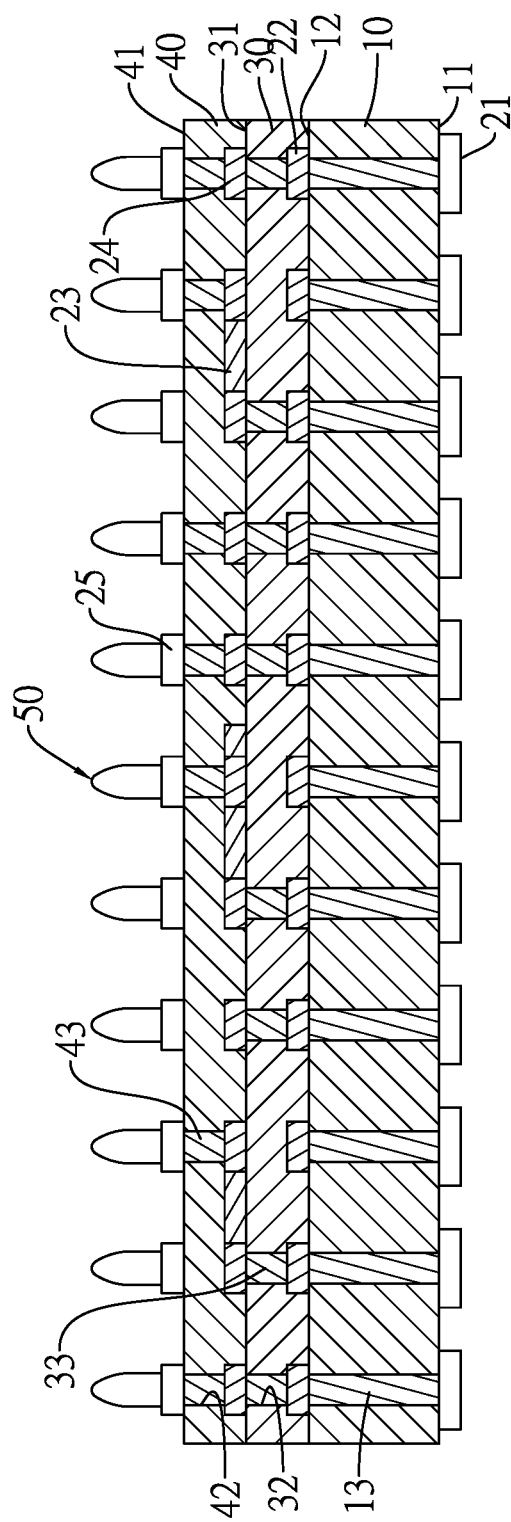
FIG. 1 is a cross-sectional side view of a PCB test fixture with adjustable density of test probes mounted thereon in accordance with the present invention.
Figure 2:
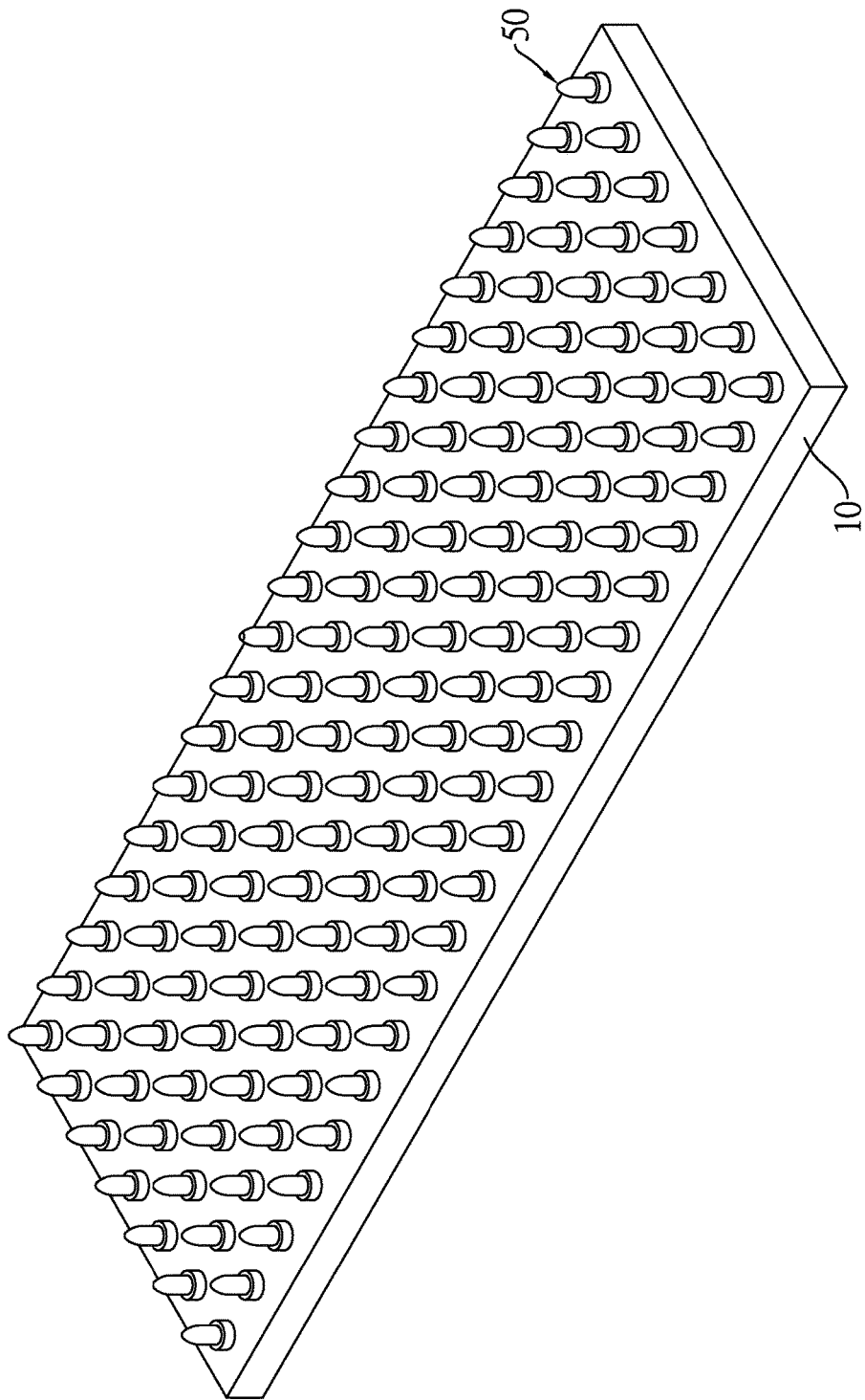
FIG. 2 is a perspective view of the PCB test fixture in FIG. 1.

With reference to FIGS. 1 and 2, a PCB (Printed Circuit Board) test fixture with adjustable density of test probes mounted thereon in accordance with the present invention includes a substrate 10, multiple lower electrodes 21, multiple upper electrodes 22, a first insulation layer 30, a conductor layer 23, multiple connection electrodes 24, a second insulation layer 40, multiple surface electrodes 25 and multiple conductive cones 50.

The substrate 10 is a ceramic substrate and has an upper surface 12, a lower surface 11 and multiple conducting members 13. The lower surface 11 is opposite to the upper surface 12.

The lower electrodes 21 are formed on the lower surface 11 of the substrate 10 and are arranged in the form of a matrix and are spaced apart from each other. The upper electrodes 22 are formed on the upper surface 12 of the substrate 10 and are aligned to vertically correspond to the respective lower electrodes 21. Each conducting member 13 is mounted through the substrate 10 with two ends thereof electrically connected to the lower electrode 21 and the upper electrode 22 adjacent thereto.

The first insulation layer 30 is formed on the upper surface 12 and the multiple upper electrodes 22 and has a first insulation surface 31, at least one first via 32 and at least one first connection member 33. The first insulation surface 31 is defined as a top surface of the first insulation layer 30. The at least one first via 32 is formed through the first insulation layer 30 and is aligned to respectively adjoin corresponding upper electrode(s) 22. The at least one first connection member 33 is respectively inserted into the at least one first via 32 and is electrically connected to the corresponding upper electrode(s) 22.

The conductor layer 23 and the multiple connection electrodes 24 are formed on the first insulation surface 31. The conductor layer 23 is electrically connected to the multiple connection electrodes 24. The multiple connection electrodes 24 and the multiple upper electrodes 22 are vertically aligned with each other. A part of the multiple connection electrodes 24 is electrically connected to the respective at least one first connection member 33 for the conductor layer 23 and the part of the multiple connection electrodes 24 to be electrically connected to a part of the multiple upper electrodes 22 through the respective at least one first connection member 33. The second insulation layer 40 is formed on the first insulation surface 31, the conductor layer 23 and the multiple connection electrodes 24 and has a second insulation surface 41, at least one second via 42 and at least one second connection member 43. The second insulation surface 41 is defined as a top surface of the second insulation layer 40. The at least one second via 42 is formed through the second insulation layer 40 and is aligned to adjoin a part of the multiple connection electrodes 24. The at least one second connection member 43 is respectively inserted into the at least one second via 42 and is electrically connected to the part of the multiple connection electrodes 24.

The multiple surface electrodes 25 are formed on the second insulation surface 41 and are vertically aligned with the respective connection electrodes 24. A part of the multiple surface electrodes 25 is electrically connected to the part of the multiple connection electrodes 24 through the respective at least one second connection member 43.

Figure 3:
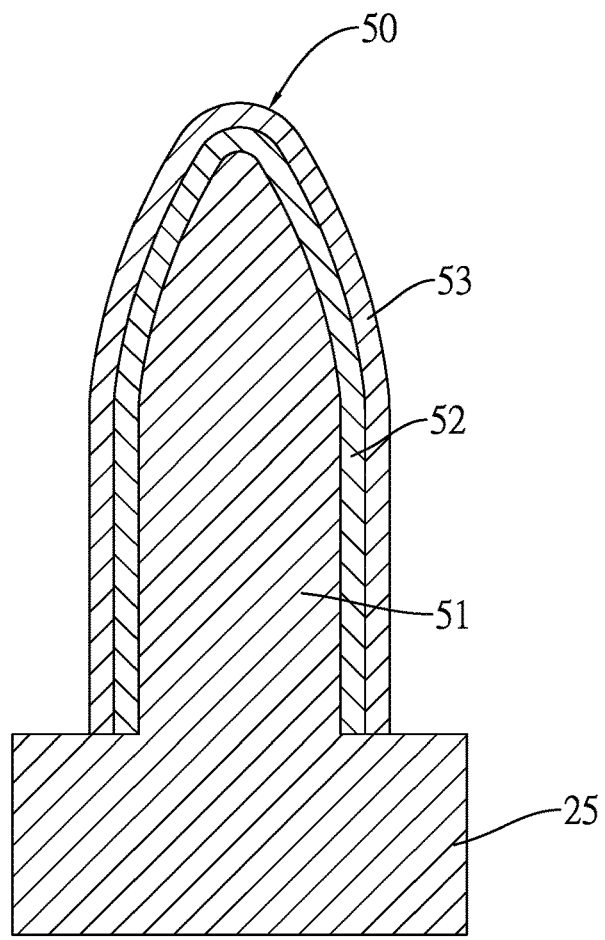
FIG. 3 is an enlarged cross-sectional side view of a conductive cone of the PCB test fixture in FIG. 2.

The multiple conductive cones 50 are formed on and electrically connected to the respective surface electrodes 25. Each conductive cone 50 progressively decreases in diameter in an upward direction perpendicular to the second insulation surface 41. With reference to FIG. 3, each conductive cone 50 has a conducting layer 51, a strengthening layer 52 and an anti-oxidant layer 53. The conducting layer 51 is conical. The strengthening layer 52 is formed around a periphery of the conducting layer 51 to enclose the conducting layer 51. The strengthening layer 52 is higher than the conducting layer 51 in hardness to increase strength of the conductive cones 50, such that the conductive cones 50 possess sufficient strength to support a PCB to be tested. The anti-oxidant layer 53 is formed around a periphery of the strengthening layer 52 to enclose the strengthening layer 52 and the conducting layer 51 therein. As the conductive cones 50 serve to electrically connect points to be tested on a PCB, to prevent conductivity of the conductive cones 50 from dropping because of oxidation, the anti-oxidant layer 53 serves to prevent the conducting layer 51 from being oxidized with external air surrounding the conductive cones 50.

The conducting layer 51 may be made from copper or a copper alloy. The strengthening layer 52 may be made from nickel, cobalt, tungsten or an alloy thereof. The anti-oxidant layer 53 may be made from gold, tin or an alloy thereof. In the present embodiment, the strengthening layer 52 may be an alloy of nickel and cobalt or an alloy of nickel and tungsten. A nickel-containing portion of the alloy of nickel and cobalt or the alloy of nickel and tungsten is in a range of 95% to 97%.

Figure 4:
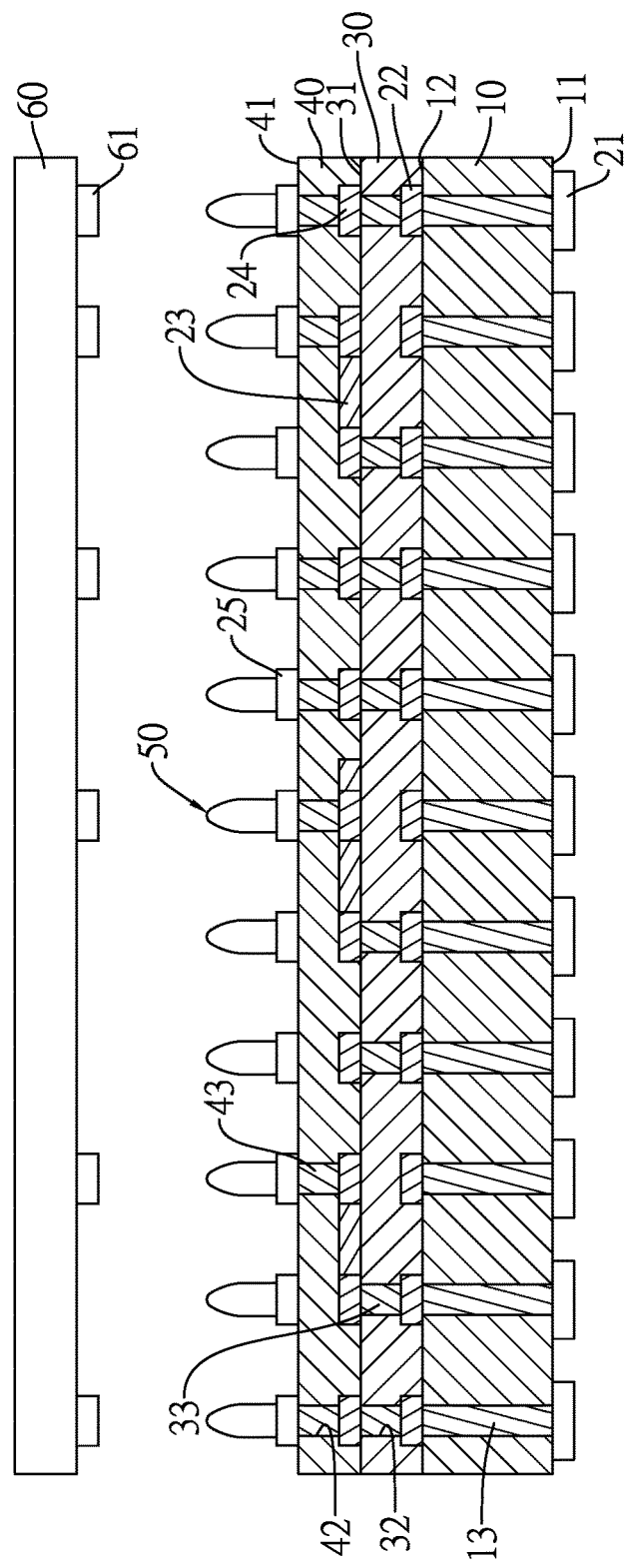
FIG. 4 is a partially cross-sectional operational side view of the PCB test fixture upon electrical testing.
Figure 5:
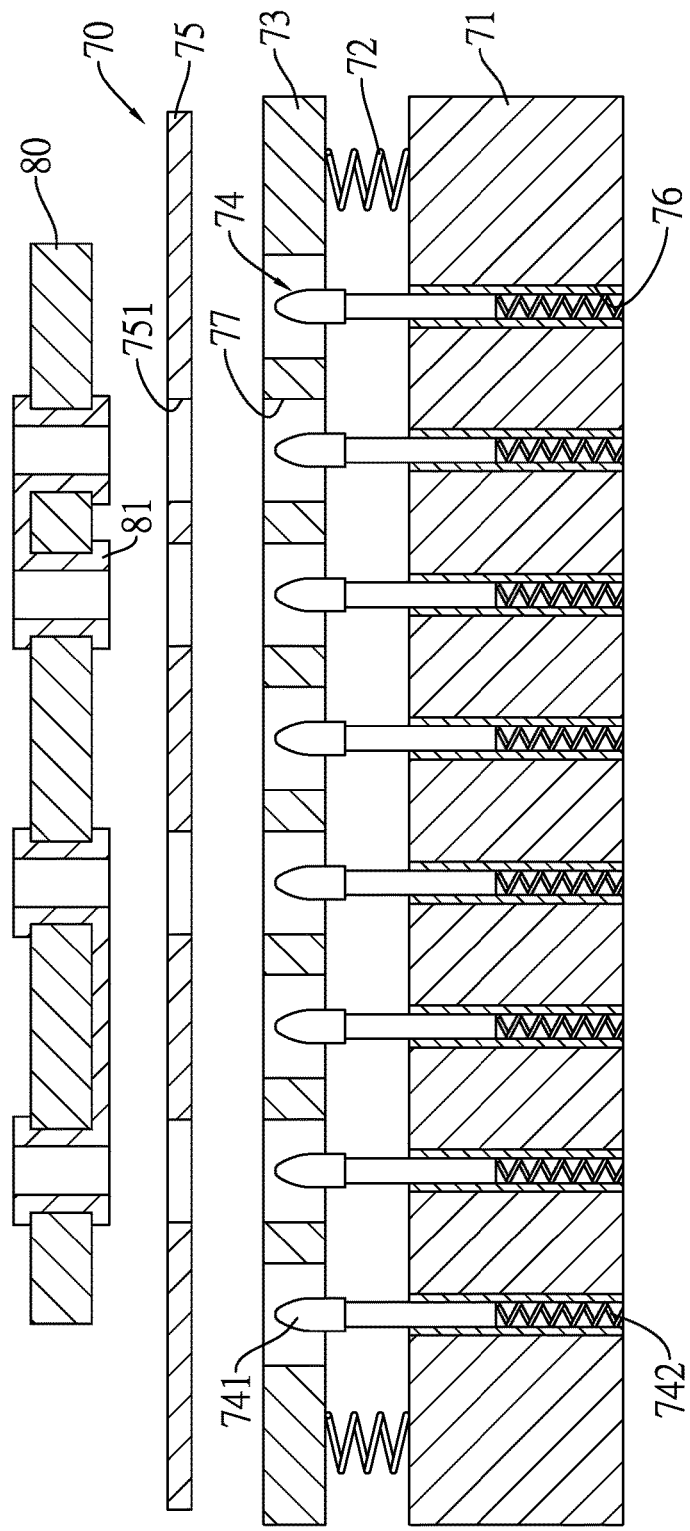
FIG. 5 is a cross-sectional side view of a conventional PCB test fixture.
Figure 6A:
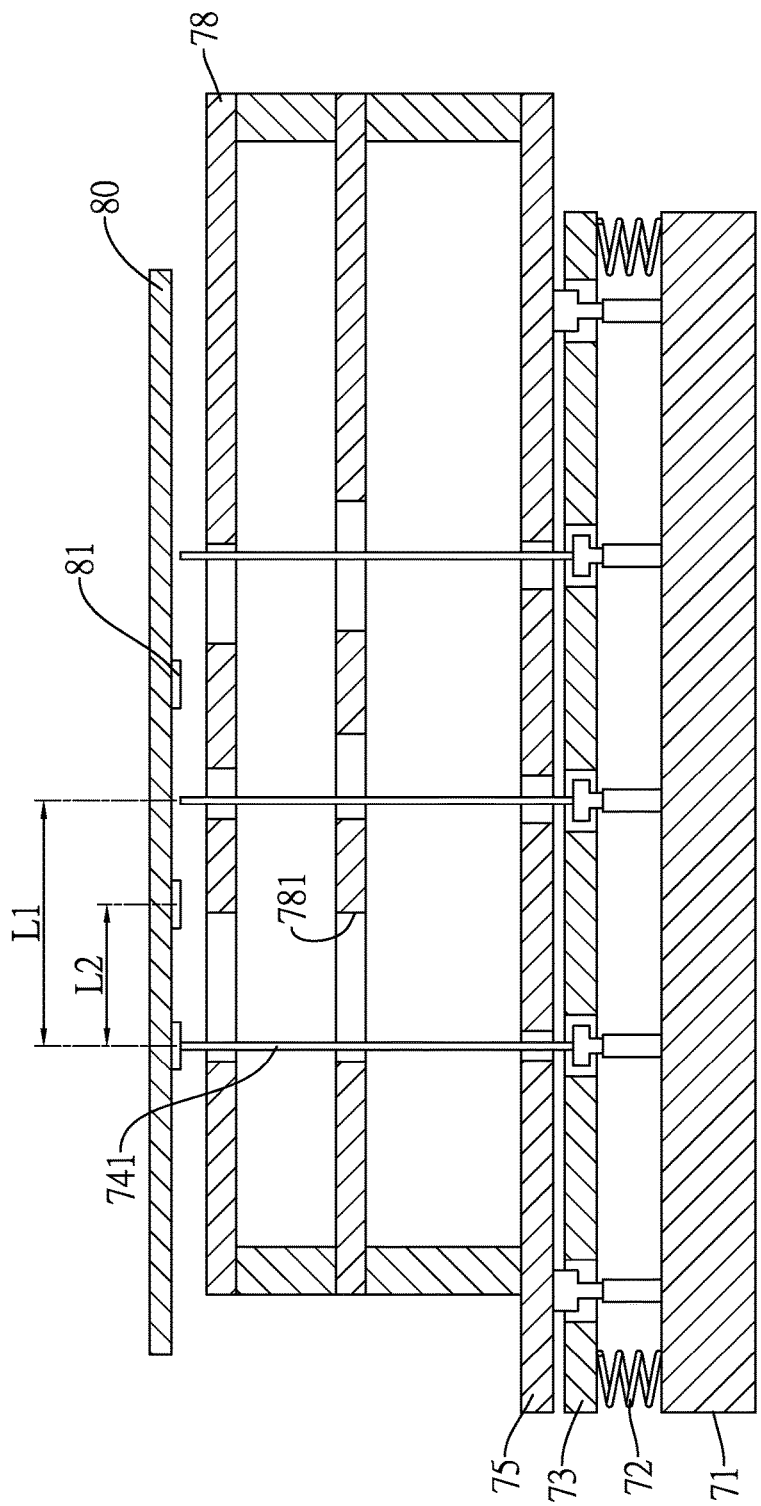
FIG. 6A is a cross-sectional side view of another conventional PCB test fixture.
Figure 6B:
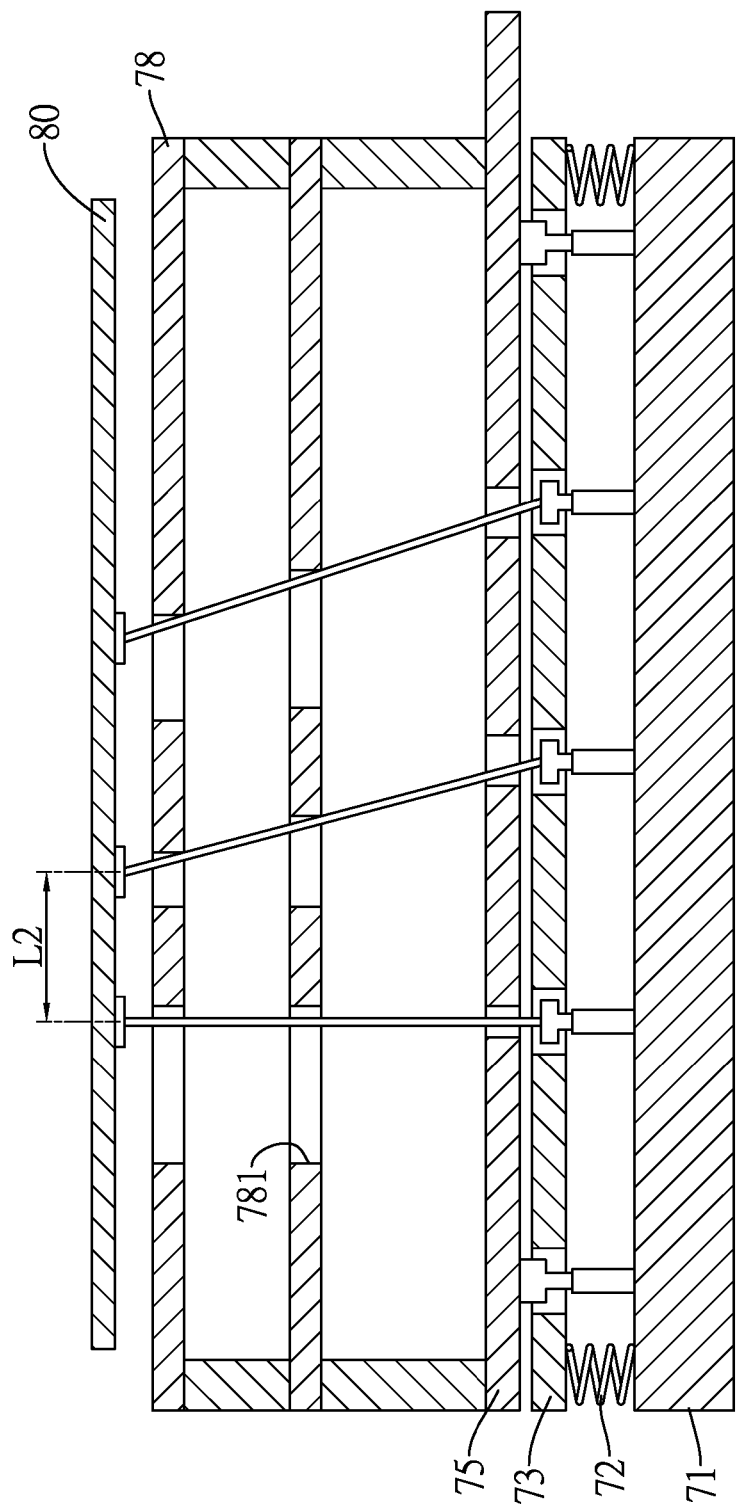
FIG. 6B is a cross-sectional operational side view of the conventional PCB test fixture in FIG. 6A.

With reference to FIG. 4, when the PCB test fixture is used to perform electrical testing of a PCB to be tested 60, the PCB test fixture is mounted to a testing device and is connected to a conducting board or multiple wires on the testing device, and the PCB to be tested 60 is placed on the conductive cones 50 for test points 61 (or electrodes) of the PCB 60 to be in contact with the conductive cones 50. The testing device employs the conducting board or the wires to transmit power to the lower electrodes 21 of the PCB test fixture to supply power to the PCB test fixture. The PCB test fixture further adopts a circuit layout of the conductor layer 23, the at least one first connection member 33 and the at least one second connection member 43 to selectively transmit the power of the testing device to the conducting cones 50 in contact with the test points 61 for performing electrical testing or circuit testing on the PCB 60. In response to locations of test points 61 varying from PCB to PCB, the circuit layout in association with the conductor layer 23, the at least one first connection member 33 and the at least one second connection member 43 may be altered to adjust current-flowing paths so as to control power to be transmitted to desired conductive cones 50. Thus, the circuit layout of the conductor layer 23, the at least one first connection member 33 and the at least one second connection member 43 should match with the test points 61 of the PCB to be tested 60.

The PCB test fixture in accordance with the present invention may be produced by current PCB fabrication processes and the circuit layout of the conductor layer 23, the at least one first connection member 33 and the at least one second connection member 43 are formed to correspond to the electrodes 61 of the PCB to be tested 60. Accordingly, PCB suppliers can complete and obtain the PCB test fixture using currently available materials, rendering the electrical testing of PCB easy.

The present invention eliminates the use of conventional stretchable probes in connection with test points 61 of the PCB to be tested 60, and the density of test probes is therefore not subject to the limitation of the distance between conventional stretchable probes. However, care should be taken to avoid electrical contact with the surface electrodes 25 underneath the conductive cones 50 of the PCB test fixture. The layout of the conductive cones 50 can be arranged at a high density. The minimum distance between the conductive cones 50 can be made to be the same as that formed by current PCB industry without any chance that the distance between the test points 61 of the PCB to be tested 60 is less than the distance between the conductive cones 50.

In sum, the PCB test fixture in accordance with the present invention employs the circuit layout of the conductor layer, the at least one first connection member and the at least one second connection member to transmit power to the conductive cones in connection with the test points on the PCB to be tested. Because the conductive cones can be arranged at a high density, higher density of test probes can be acquired upon the use of the PCB test fixture for electrical testing. As can be completed by current PCB fabrication processes, the PCB test fixture can be made in a simpler way. Moreover, upon using the PCB test fixture for electrical testing, electrical testing efficiency increases and material cost for electrical testing decreases because no additional device is required and no probe replacement is necessary. Even though trace width and trace of PCB made by current PCB industry become finer and finer and thinner and thinner, the technique of the PCB test fixture is synchronous with current PCB fabrication technique. As such, the density of test probes in accordance with the present invention can keep abreast of the technique of PCB industry, thereby resolving the issue of insufficient density of conventional stretchable probes upon electrical testing.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A printed circuit board (PCB) test fixture with adjustable density of test probes mounted thereon, comprising:
   a substrate having a lower surface and an upper surface;
   multiple lower electrodes formed on the lower surface of the substrate;
   multiple upper electrodes formed on the upper surface of the substrate, vertically aligned with the respective lower electrodes, and electrically connected to the respective lower electrodes;
   a first insulation layer formed on the upper surface of the substrate and having at least one first connection member electrically connected to corresponding upper electrodes;
   a conductor layer formed on the first insulation layer and electrically connected to the at least one first connection member and the corresponding upper electrodes;

multiple connection electrodes formed on the first insulation layer and vertically aligned with the respective upper electrodes, wherein a part of the multiple connection electrodes is electrically connected to the respective at least one first connection member for the conductor layer and the part of the multiple connection electrodes to be electrically connected to a part of the multiple upper electrodes through the respective at least one first connection member;

a second insulation layer formed on the first insulation layer and having at least one second connection member electrically connected to the conductor layer;

multiple surface electrodes formed on the second insulation layer and vertically aligned with the respective connection electrodes, wherein a part of the multiple surface electrodes is connected to the respective at least one second connection member; and multiple conductive cones formed on the second insulation layer, mounted on the respective surface electrodes, and adapted to electrically contact a PCB to be tested, wherein a part of the multiple conductive cones is electrically connected to the respective at least one second connection member, and a minimum distance is formed between each adjacent two of the multiple conductive cones without causing electrical contact with the respective surface electrodes underneath the multiple conductive cones;

wherein a circuit layout of the conductor layer, the at least one first connection member and the at least one second connection member are formed to correspond to electrodes of the PCB to be tested.

2. The PCB test fixture as claimed in claim 1, wherein each conductive cone has:
   a conducting layer being conical;
   a strengthening layer formed around a periphery of the conducting layer to enclose the conducting layer; and
   an anti-oxidant layer formed around a periphery of the strengthening layer to enclose the strengthening layer and the conducting layer therein.

3. The PCB test fixture as claimed in claim 2, wherein the conducting layer is made from one of copper and a copper alloy.

4. The PCB test fixture as claimed in claim 2, wherein the strengthening layer is made from one of nickel, cobalt, tungsten and an alloy thereof.

5. The PCB test fixture as claimed in claim 2, wherein the anti-oxidant layer is made from one of gold, tin and an alloy thereof.

6. The PCB test fixture as claimed in claim 1, wherein the substrate is a ceramic substrate.

7. The PCB test fixture as claimed in claim 2, wherein the substrate is a ceramic substrate.

8. The PCB test fixture as claimed in claim 3, wherein the substrate is a ceramic substrate.

9. The PCB test fixture as claimed in claim 4, wherein the substrate is a ceramic substrate.

10. The PCB test fixture as claimed in claim 5, wherein the substrate is a ceramic substrate.

* * * * *